United States Patent
Chang

(10) Patent No.: US 9,344,036 B1
(45) Date of Patent: May 17, 2016

(54) VOLTAGE-CONTROLLED OSCILLATOR (VCO) WITH AMPLITUDE CONTROL

(71) Applicant: QUALCOMM Incorporated, San Diego, CA (US)

(72) Inventor: Jae-Hong Chang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/615,794

(22) Filed: Feb. 6, 2015

(51) Int. Cl.
*H03B 5/12* (2006.01)
*H03L 5/00* (2006.01)

(52) U.S. Cl.
CPC ............ *H03B 5/1234* (2013.01); *H03B 5/1212* (2013.01); *H03B 5/1228* (2013.01); *H03B 5/1278* (2013.01)

(58) Field of Classification Search
CPC .. H03B 5/1206; H03B 5/1212; H03B 5/1228; H03B 5/1234; H03B 5/1278; H03B 2201/031; H03L 5/00; H03L 5/02
USPC .......... 331/15, 109, 117 FE, 117 R, 182, 183, 331/185, 186
See application file for complete search history.

(56) References Cited

U.S. PATENT DOCUMENTS

| | | | | |
|---|---|---|---|---|
| 6,064,277 A | * | 5/2000 | Gilbert ...................... | H03L 5/00 331/109 |
| 6,653,908 B1 | * | 11/2003 | Jones ........................ | H03L 5/00 331/177 V |
| 6,680,655 B2 | * | 1/2004 | Rogers ................. | H03B 5/1231 331/109 |
| 6,750,726 B1 | * | 6/2004 | Hung .................... | H03B 5/1228 331/100 |
| 6,838,952 B2 | | 1/2005 | Ramet | |
| 6,909,336 B1 | * | 6/2005 | Rajagopalan ............. | H03L 5/00 331/109 |
| 7,196,592 B2 | * | 3/2007 | Shi ........................... | H03B 5/04 331/117 FE |
| 7,675,374 B2 | * | 3/2010 | Min ......................... | H03B 5/04 331/109 |
| 7,978,017 B2 | * | 7/2011 | Pernia ...................... | H03B 5/04 331/1 R |
| 8,134,417 B2 | | 3/2012 | Chiang et al. | |
| 8,710,937 B1 | * | 4/2014 | Sutardja ............... | H03B 5/1228 331/109 |
| 2006/0012447 A1 | * | 1/2006 | Partovi ..................... | H03L 5/00 331/185 |
| 2013/0222070 A1 | | 8/2013 | Liscidini et al. | |
| 2013/0271226 A1 | | 10/2013 | Sinoussi | |
| 2014/0009236 A1 | | 1/2014 | Choi et al. | |

* cited by examiner

*Primary Examiner* — Levi Gannon
(74) *Attorney, Agent, or Firm* — Patterson & Sheridan, LLP

(57) ABSTRACT

Certain aspects of the present disclosure generally relate to automatic amplitude control of an oscillating signal output from a voltage-controlled oscillator (VCO) using feedback from an amplitude adjustment circuit. The VCO may comprise cross-coupled metal oxide semiconductor (MOS) transistors coupled to a resonant tank circuit. Gates of the cross-coupled transistors are configured to control an amplitude of the oscillating signal generated by the resonant tank circuit. In certain aspects, the amplitude adjustment circuit may comprise a peak detector that generates a signal that is representative of the amplitude of the oscillating signal. The signal generated by the peak detector may be compared to a reference voltage by an amplifier. The amplifier may generate a feedback signal to control the gates of the cross-coupled MOS transistors based on the comparison, thereby adjusting the amplitude of the oscillating signal.

16 Claims, 10 Drawing Sheets

VOLTAGE-CONTROLLED OSCILLATOR (VCO) WITH AMPLITUDE CONTROL

TECHNICAL FIELD

Certain aspects of the present disclosure generally relate to electronic circuits and, more particularly, to regulating an oscillating signal generated by a voltage-controlled oscillator (VCO).

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1xRTT (1 times Radio Transmission Technology, or simply 1x), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to regulating the amplitude of an oscillating signal generated by a voltage-controlled oscillator (VCO) using feedback.

Certain aspects of the present disclosure provide an oscillator circuit. The oscillator circuit generally includes a VCO configured to generate an oscillating signal, wherein the VCO comprises first cross-coupled metal oxide semiconductor (MOS) transistors whose gates are configured to control an amplitude of the oscillating signal; and an amplitude adjustment circuit configured to generate a feedback signal based on the oscillating signal, wherein the feedback signal is configured to control the gates of the first MOS transistors.

According to certain aspects, the first MOS transistors comprise PMOS transistors.

According to certain aspects, the amplitude adjustment circuit comprises a peak detecting circuit configured to output a voltage representative of the amplitude of the oscillating signal and an amplifier. The amplifier is typically configured to compare the voltage output by the peak detecting circuit to a reference voltage and to output the feedback signal based on the comparison. In certain aspects, the VCO is AC-coupled to the peak detecting circuit.

According to certain aspects, the gates of the first MOS transistors are AC-coupled to an output of the VCO.

In certain aspects, the feedback signal is fed back to the gates of the first MOS transistors via a plurality of resistors.

In certain aspects, the VCO further includes a resonant tank circuit coupled to the first MOS transistors.

According to certain aspects, the oscillating signal comprises a differential output and the tank circuit comprises an inductor coupled between the differential output. In this case, the amplitude adjustment circuit may include an amplifier configured to compare a voltage from a center tap of the inductor and a reference voltage and to output the feedback signal based on the comparison.

In certain aspects, the amplitude adjustment circuit includes an amplifier configured to compare a voltage representative of the amplitude of the oscillating signal and a reference voltage, an output of the amplifier controls a variable resistance, and the variable resistance controls the gates of the first MOS transistors.

In certain aspects, the amplitude adjustment circuit includes an amplifier configured to compare a voltage representative of the amplitude of the oscillating signal and a reference voltage and a current mirror. The current mirror is typically configured to regulate a current, wherein the current regulated by the current mirror controls the gates of the first MOS transistors and wherein an output of the amplifier controls the current mirror based on the comparison.

In certain aspects, the VCO further comprises second cross-coupled MOS transistors. In this case, the amplitude adjustment circuit may include a first amplifier configured to compare a voltage representative of the amplitude of the oscillating signal and a reference voltage to generate the feedback signal and a second amplifier configured to compare the reference voltage and a voltage based on the feedback signal to generate another feedback signal, wherein the other feedback signal controls gates of the second MOS transistors. In certain aspects, the first MOS transistors comprise PMOS transistors, and the second MOS transistors comprise NMOS transistors.

Certain aspects of the present disclosure provide a method for generating a regulated oscillating signal. The method generally includes generating the oscillating signal with a VCO comprising first cross-coupled MOS transistors, generating a feedback signal based on the oscillating signal, and adjusting an amplitude of the oscillating signal via gates of the first cross-coupled MOS transistors based on the feedback signal.

Certain aspects of the present disclosure provide an apparatus for generating a regulated oscillating signal. The apparatus generally includes means for generating the oscillating signal, comprising first cross-coupled MOS transistors; and means for generating a feedback signal based on the oscillating signal to adjust amplitude of the oscillating signal via gates of the first cross-coupled MOS transistors based on the feedback signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure generally relate to automatic amplitude control (AAC) of an oscillating signal generated by a voltage-controlled oscillator (VCO), using feedback from an amplitude adjustment circuit. The VCO may comprise cross-coupled metal oxide semiconductor (MOS) transistors coupled to a resonant tank circuit, where gates of the cross-coupled transistors are controlled by the feedback to adjust an amplitude of the oscillating signal.

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
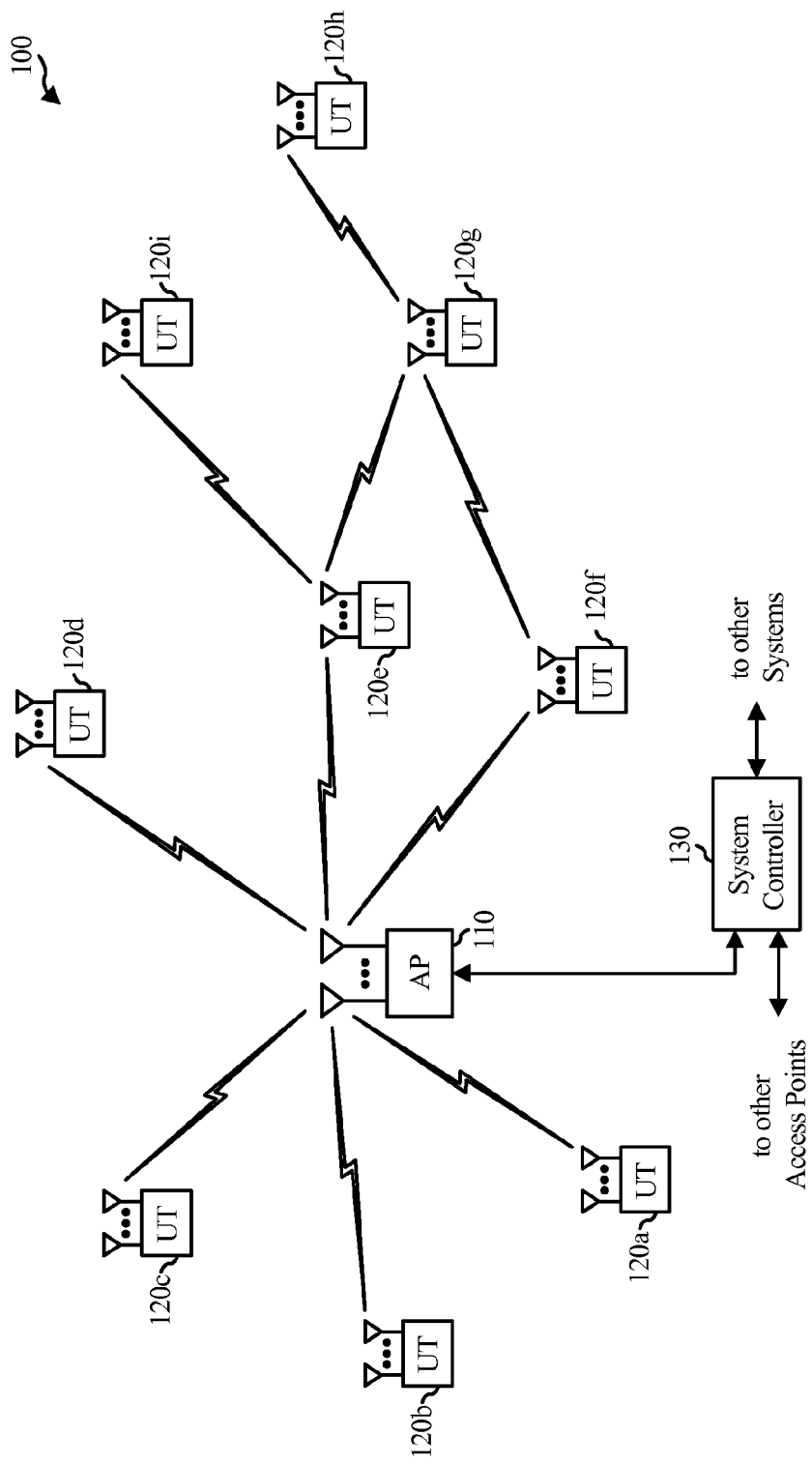
FIG. 1 is a diagram of an example wireless communications network in accordance with certain aspects of the present disclosure.

FIG. 1 illustrates a wireless communications system 100 with access points 110 and user terminals 120, either of which may include or utilize aspects of the present disclosure. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc. In certain aspects of the present disclosure, the AP and/or UT may comprise a transceiver front-end having a voltage-controlled oscillator (VCO). The AP and/or UT may further comprise an amplitude adjustment circuit configured to adjust the amplitude of an oscillating signal generated by the VCO, as described below.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

Figure 2:
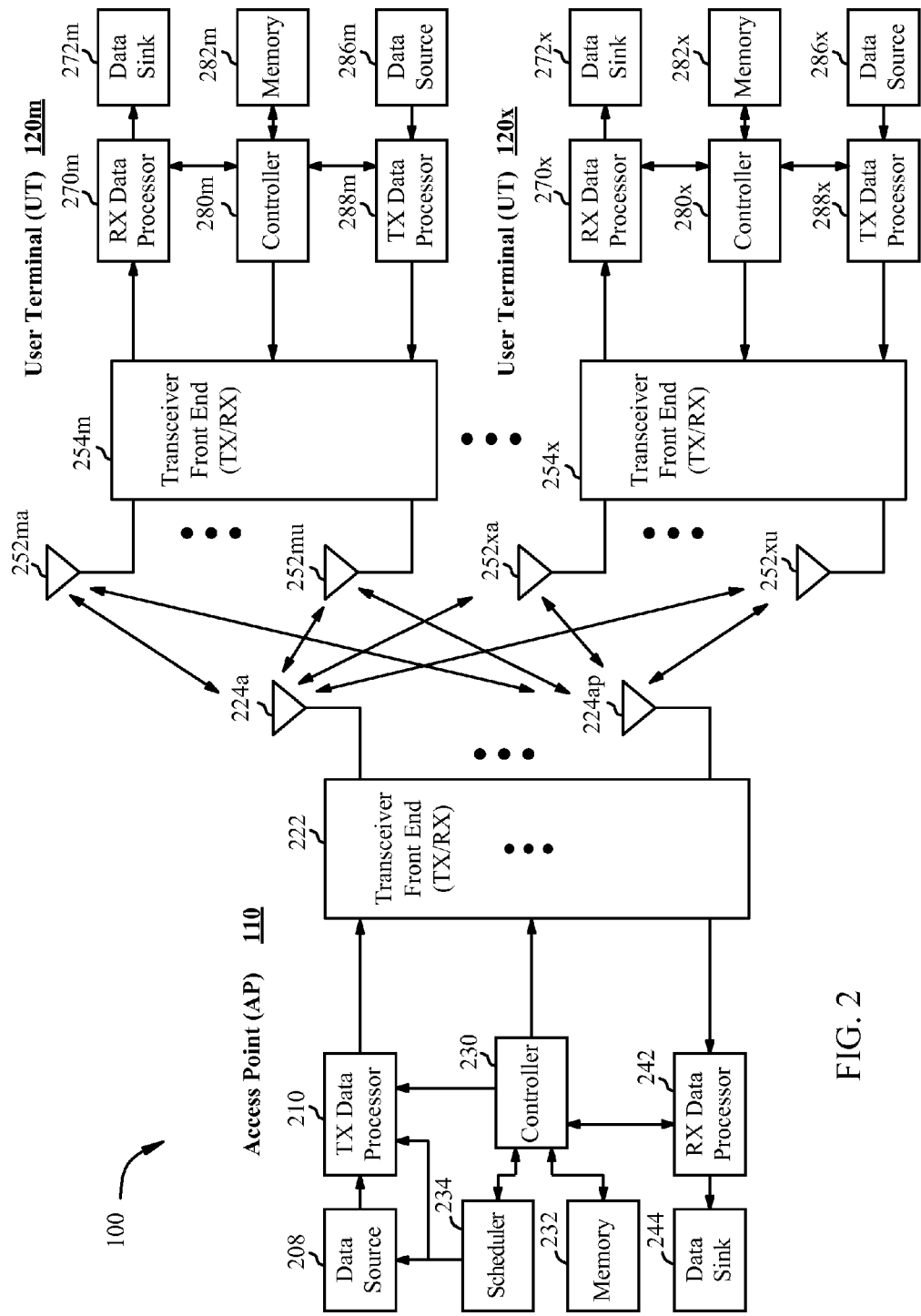
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects of the present disclosure, either or both transceiver front ends 222 and 254 may comprise a VCO and an adjustment circuit. The adjustment circuit may be configured to adjust the amplitude of an oscillating signal generated by the VCO, as described below.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230

Figure 3:
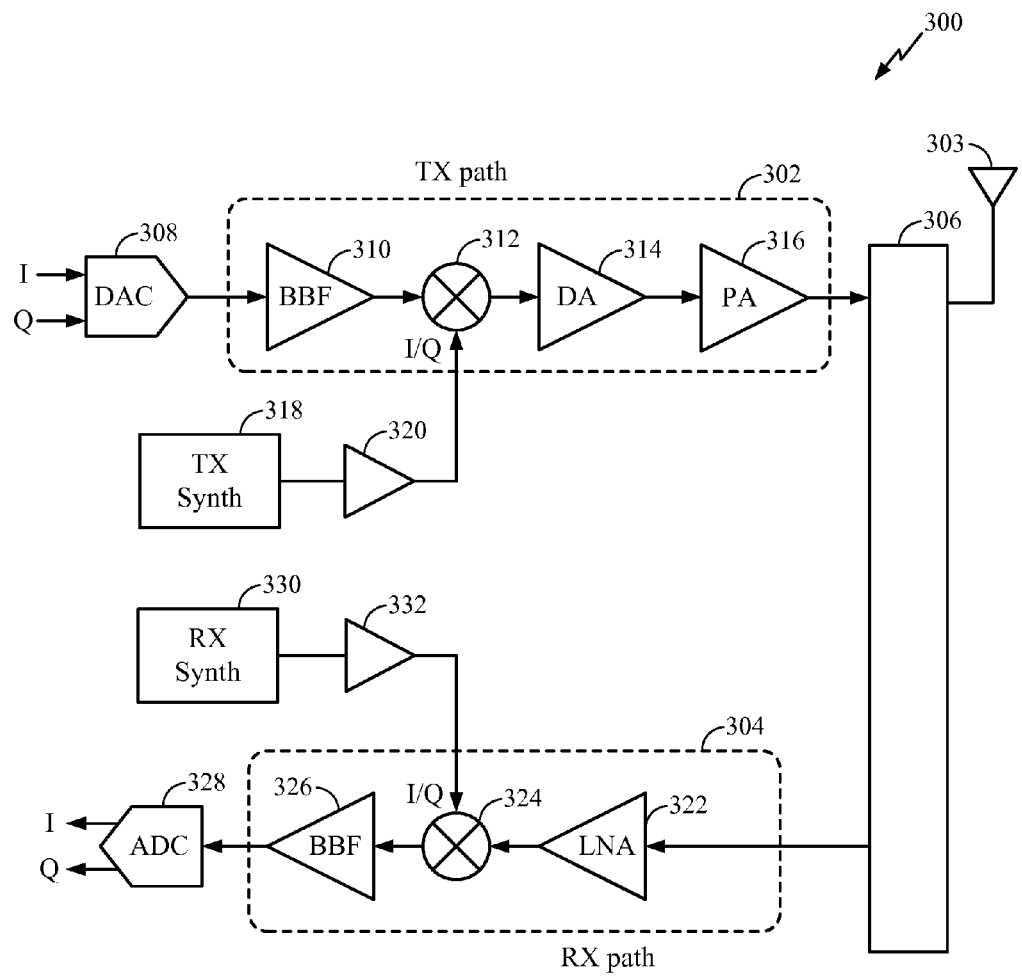
FIG. 3 is a block diagram of an example transceiver front end in accordance with certain aspects of the present disclosure.

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). Known as heterodyning, this frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324. In certain aspects of the present disclosure, the TX and/or RX frequency synthesizer 318, 330 may comprise a VCO and an adjustment circuit. The adjustment circuit may be configured to adjust the amplitude of an oscillating signal generated by the VCO, as described below.

An Example Regulated Voltage-Controlled Oscillator

The voltage swing of an oscillating signal generated by a VCO may change as a result of multiple factors, such as power supply voltage and temperature. The oscillating signal generated by the VCO may drive one or more frequency dividers. Therefore, voltage swing of a VCO can affect the operations of the frequency dividers and any other circuits receiving the VCO's oscillating signal. Therefore, what is needed is a well-regulated VCO that generates an oscillating signal having constant amplitude.

Figure 4:
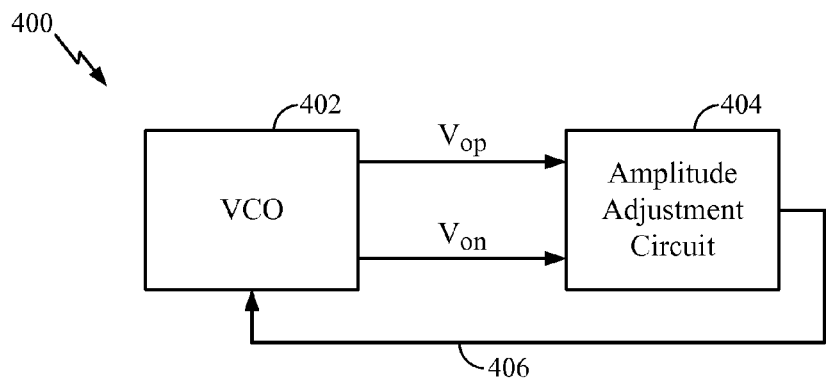
FIG. 4 is a block diagram of a voltage-controlled oscillator (VCO) and an amplitude adjustment circuit, in accordance with certain aspects of the present disclosure.

Certain aspects of the present disclosure generally relate to techniques and apparatus for generating an oscillating signal having a constant amplitude using feedback. For example, as illustrated in the block diagram 400 of FIG. 4, a VCO 402 may generate a differential oscillating signal (e.g., voltage potential across positive output terminal $V_{OP}$ and negative output terminal $V_{ON}$). An amplitude adjustment circuit 404 may sense the oscillating signal (or a signal representing the amplitude thereof) and generate a feedback signal 406 accordingly. The feedback signal 406 is fed back to the VCO 402, and the VCO automatically adjusts the amplitude of the oscillating signal based on the feedback signal such that the amplitude remains stable, despite changes in voltage and temperature. This type of VCO may be referred to as an automatic amplitude control (AAC) VCO.

Figure 5:
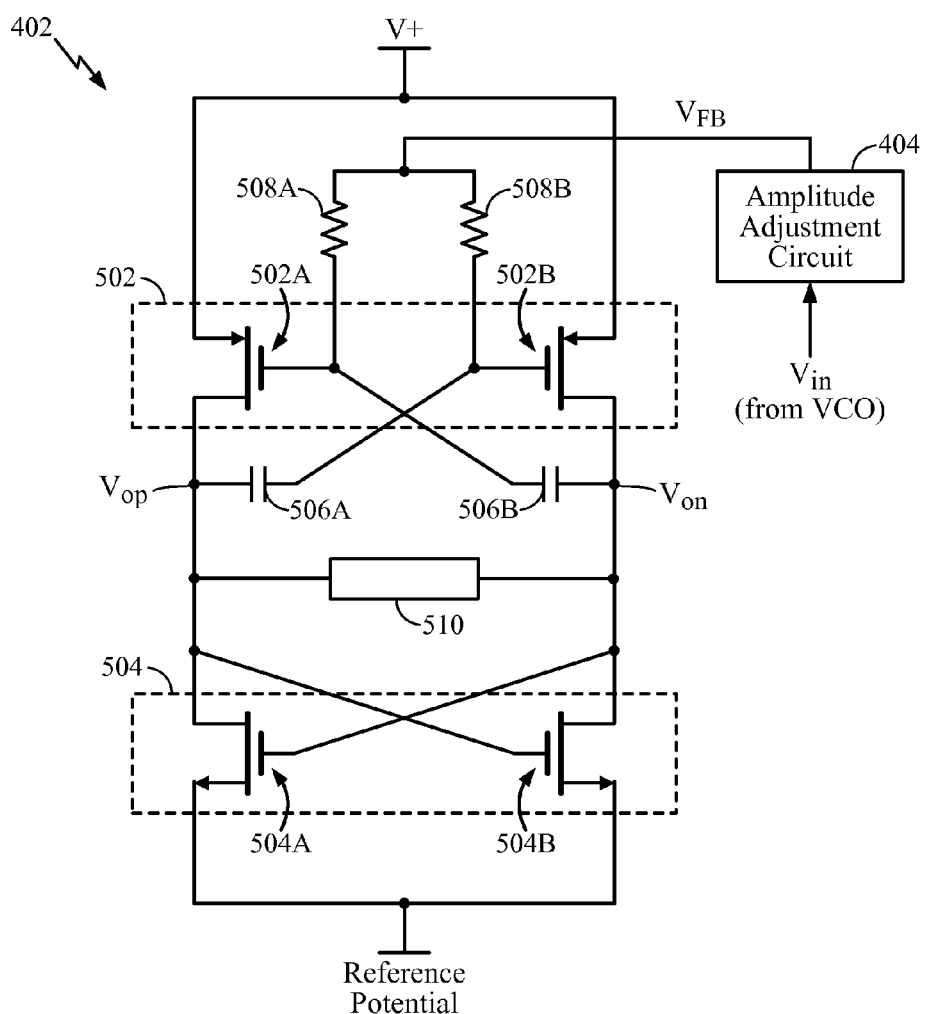
FIG. 5 is a circuit diagram of a regulated VCO configured to adjust an oscillating signal using feedback, in accordance with certain aspects of the present disclosure.

FIG. 5 illustrates an example VCO 402 controlled by an amplitude adjustment circuit 404 in accordance with certain aspects of the present disclosure. The VCO 402 comprises cross-coupled p-channel metal oxide semiconductor (PMOS) transistors 502 coupled with a resonant circuit 510. The resonant circuit 510 may comprise a resonant tank circuit having an inductor connected to the drains of the transistors 502 and a variable capacitance, where adjusting the capacitance changes the resonant frequency. The variable capacitance may be implemented with a varactor or an array of selectable capacitors, for example. The cross-coupled transistors 502 form an active negative transconductance ($-g_m$) circuit that serves to cancel out the loss (due to parasitics) of the resonant circuit 510 and, thus, to sustain the oscillation mechanism.

In certain aspects, the VCO 402 may be an AC-coupled PMOS VCO. For example, the gate of PMOS 502A may be AC-coupled to the drain of PMOS 502B with a capacitor 506B. Similarly, the gate of the PMOS 502B may be AC-coupled to the drain of the PMOS 502A via a capacitor 506A. An AC-coupled PMOS VCO provides several advantages over other types of VCOs which, for example, may have direct connections between the gates of the cross-coupled transistors and the resonant circuit 510. For example, these advantages may include an improved power supply rejection ratio (PSRR) at the output of the resonant circuit 510.

For certain aspects as illustrated in FIG. 5, the cross-coupled PMOS transistors 502 and the resonant circuit 510 may be coupled with cross-coupled n-channel metal oxide semiconductor (NMOS) transistors 504. For certain aspects, the gates of the transistors 504 may be directly connected with the resonant circuit 510. The sources of the transistors 504 may be coupled to a reference potential (e.g., electrical ground).

The current through the cross-coupled transistors 502 and 504 controls the amplitude of the oscillating signal generated by the VCO 402 using the resonant circuit 510. Therefore, the amplitude of the oscillating signal may be controlled via the gate voltages of the PMOS and/or NMOS cross-coupled transistors 502, 504. As illustrated in FIG. 5, an adjustment circuit 404 may control the gate voltages of the PMOS transistors 502 based on a voltage that is representative of the amplitude of the oscillating signal. By controlling the gate voltages of the PMOS transistors 502, the amplitude adjustment circuit 404 may be configured to control the amplitude of the oscillating signal generated by the VCO 402 such that the amplitude remains constant. For example, the amplitude adjustment circuit 404 may sense the amplitude of the oscillating signal (or a signal corresponding thereto) and generate a feedback signal ($V_{FB}$) that controls the gate voltages of the cross-coupled PMOS transistors 502 through resistors 508A and 508B. Additionally or alternatively, the amplitude adjustment circuit 404 may control the gate voltages of the cross-coupled NMOS transistors 504 in a similar manner, as will be discussed in more detail herein.

Figure 6:
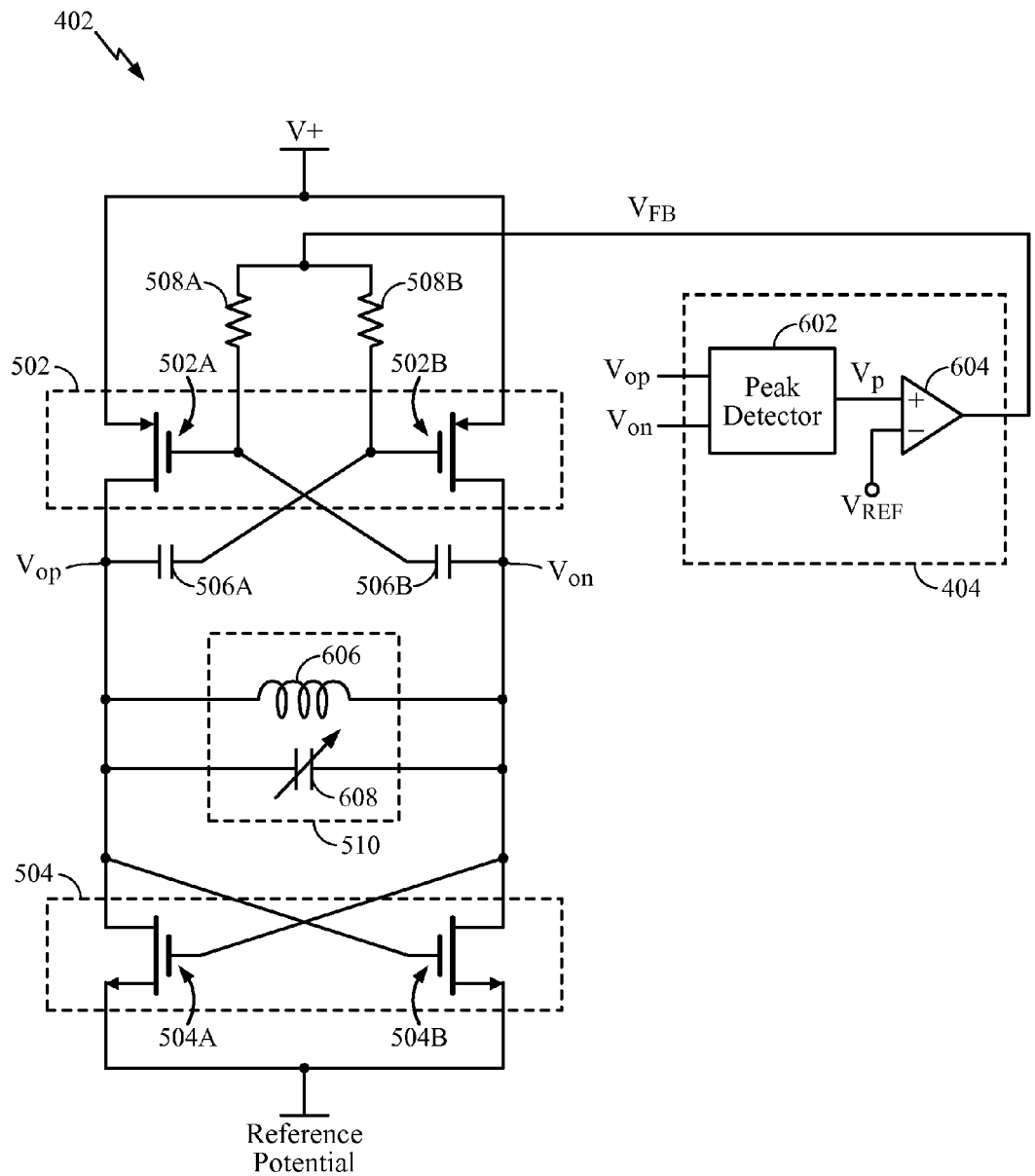
FIG. 6 is a circuit diagram of a VCO and an amplitude adjustment circuit configured to generate a feedback signal for the regulating the VCO, in accordance with certain aspects of the present disclosure.

FIG. 6 illustrates a circuit diagram of the VCO 402 and the adjustment circuit 404, in accordance with certain aspects of the present disclosure. Here, the adjustment circuit 404 comprises a peak detector 602 that senses the output from the VCO and generates a peak voltage ($V_P$) that is representative of the amplitude of the oscillating signal. For example, the differential output of the VCO may be coupled with the peak detector 602. In certain aspects, the differential output of the VCO ($V_{OP}$ and $V_{ON}$) may be AC-coupled (not shown) with the peak detector 602. $V_P$ may be compared to a reference voltage ($V_{REF}$) by an amplifier 604. The amplifier 604 may generate the feedback signal based on the comparison between $V_P$ and $V_{REF}$. For example, as the difference between $V_P$ and $V_{REF}$ increases, the output voltage ($V_{FB}$) of the amplifier 604 also increases. In certain aspects, the output of the peak detector 602 ($V_P$) may be coupled to a positive terminal of the amplifier 604, and the reference signal ($V_{REF}$) may be coupled to the negative terminal of the amplifier 604. In this manner, the amplitude adjustment circuit 404 actively controls the amplitude of the oscillating signal such that the amplitude remains stable. The reference voltage ($V_{REF}$) may be used to adjust the desired amplitude of the oscillating signal generated by the VCO 402.

As described above with respect to FIG. 5, the PMOS and NMOS cross-coupled transistors 502, 504 may be coupled to a resonant circuit 510. As illustrated in FIG. 6, the resonant circuit 510 may be a tank circuit comprising an inductor 606 and a variable capacitor 608. The variable capacitor 608 may comprise at least one varactor. In other aspects, the variable capacitor 608 may be implemented as a capacitor array for generating different capacitor values. At least one switch may be associated with each capacitor in the capacitor array. Therefore, the at least one switch may be used to adjust the capacitance of the resonant tank circuit by selecting a combination of one or more capacitors in the capacitor array. For certain aspects, a varactor and a capacitor array may both be used.

Figure 7:
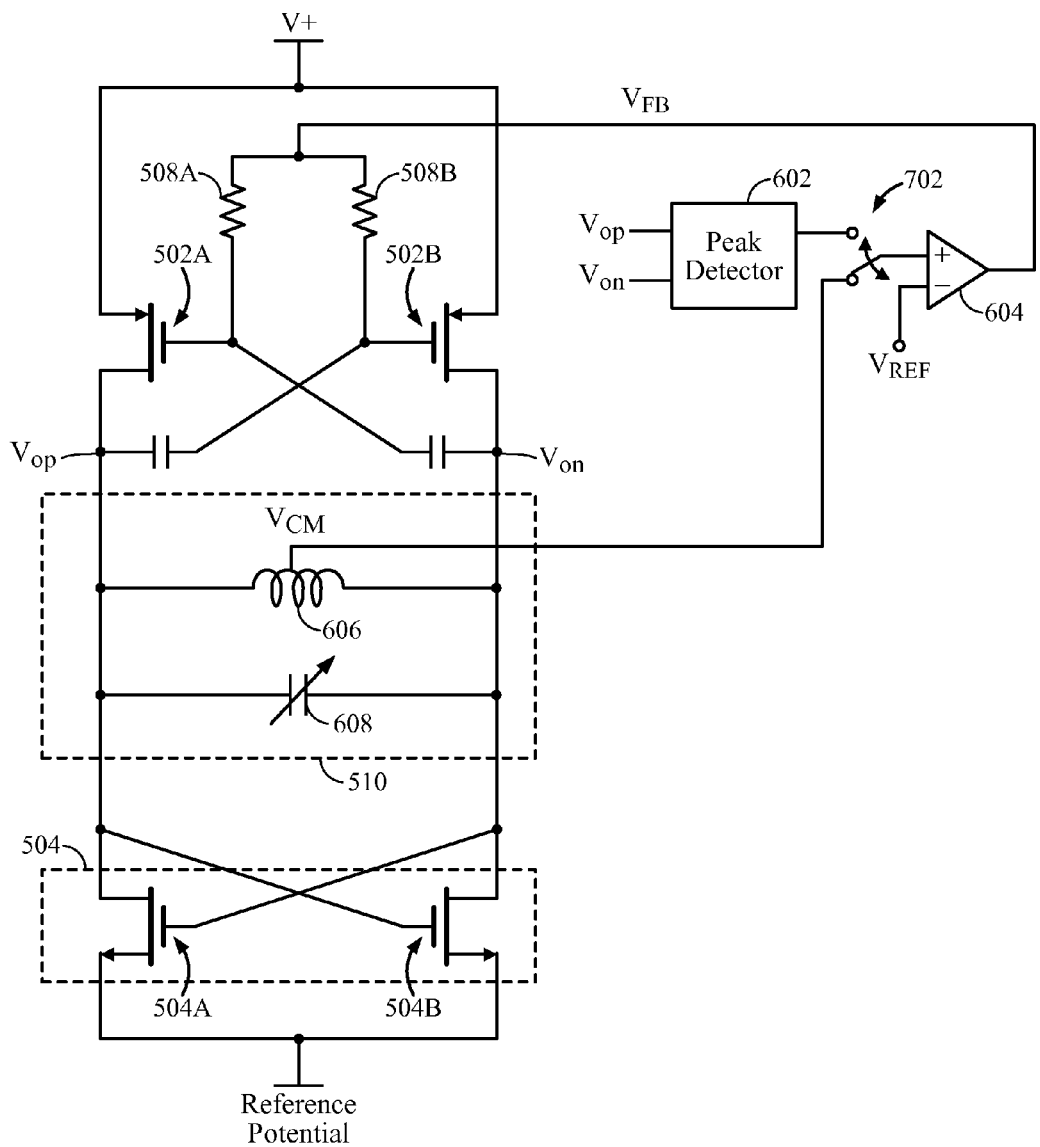
FIG. 7 is a circuit diagram of a VCO and an amplitude adjustment circuit having a switch to alter an input to the amplitude adjustment circuit, in accordance with certain aspects of the present disclosure.

In certain aspects of the present disclosure, the VCO output may be a differential output, and the amplitude adjustment circuit 404 may control the gate voltages of the cross-coupled transistors 502 based on a common-mode voltage ($V_{CM}$) of the VCO output. For example, the inductor 606 may be a center-tapped inductor, as illustrated in FIG. 7. The positive terminal of the amplifier 604 may be coupled to a switch 702, which is configured to alter the connection to the amplifier 604 between the peak detector 602 and the center tap of the inductor 606. For example, the switch 702 may be configured to connect the center tap of the inductor 606 to the positive terminal of the amplifier 604. In this configuration, the amplifier 604 compares the common-mode voltage ($V_{CM}$) of the VCO output and the reference voltage ($V_{REF}$) to generate the feedback signal in a similar manner as described above with respect to FIG. 6. In certain aspects, a controller, such as the controller 230 or 280 of FIG. 2, may control the switch 702. For certain aspects, the switch 702 may initially be configured to connect the positive terminal of the amplifier 604 with the center tap of the inductor 606 during power up, for example. Following power up, the switch 702 may be changed to connect the positive terminal of the amplifier 604 with the output of the peak detector 602.

Figure 8:
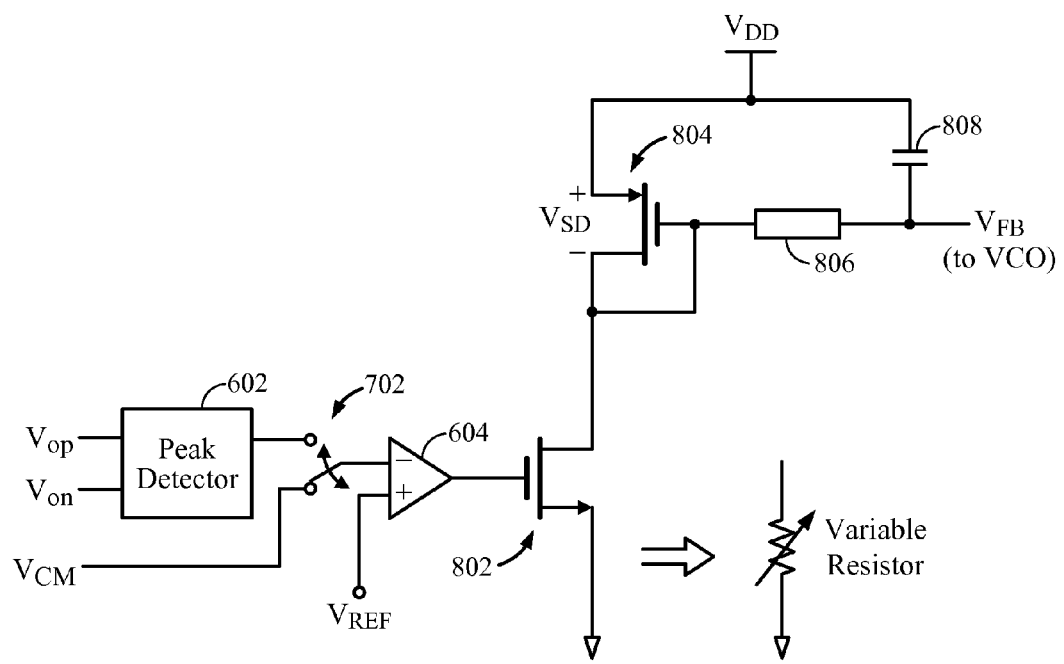
FIG. 8 illustrates an amplitude adjustment circuit comprising a variable resistance used to control the feedback signal to a VCO, in accordance with certain aspects of the present disclosure.

In certain aspects of the present disclosure, the output of the amplifier 604 may control a variable resistance, wherein the resistance controls the feedback signal to the VCO 402. For example, as illustrated in FIG. 8, the output of the amplifier 604 may be coupled with a gate an NMOS transistor 802. A drain of the NMOS transistor 802 may be coupled with a drain and a gate of a diode-connected PMOS transistor 804. The amplifier 604 may control a current ($I_{DS}$) flowing through the NMOS transistor 802 (e.g., from drain to source) by controlling the gate voltage ($V_{GS}$) of the NMOS transistor 802. The gate and drain of the transistor 804 are coupled with the feedback voltage $V_{FB}$ though a resistor 806, for example. Therefore, by controlling the $I_{DS}$ of transistor 802, the feedback voltage ($V_{FB}$) is adjusted based on the supply voltage ($V_{DD}$) and the voltage drop ($V_{SD}$) across the transistor 804. In certain aspects, a capacitor 808 may be coupled between the $V_{FB}$ and $V_{DD}$ to function as a low-pass filter since the $V_{FB}$ node may otherwise be sensitive to noise and power supply perturbations.

Figure 9:
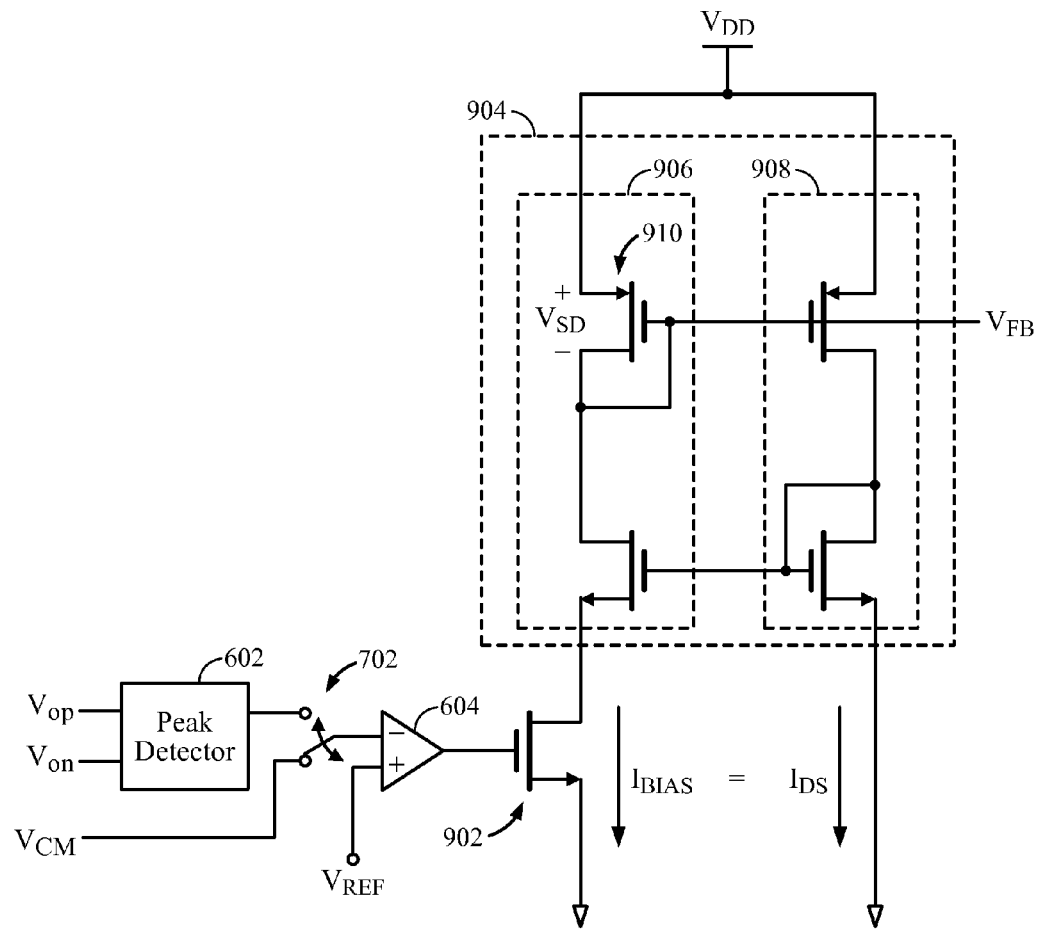
FIG. 9 illustrates an amplitude adjustment circuit comprising a current mirror used to control the feedback signal to a VCO, in accordance with certain aspects of the present disclosure.

As illustrated in FIG. 9, the output of the amplifier 604 may control a gate voltage of an NMOS transistor 902 configured to control a current through a current mirror 904, according to certain aspects of the present disclosure. The current mirror 904 is configured to match a current through transistors 906 with a current through transistors 908. By controlling the gate voltage of the NMOS transistor 902, the amplifier 604 controls a current ($I_{BIAS}$) through the NMOS transistor 902 which also flows through the transistors 906. The feedback voltage ($V_{FB}$) is coupled to a gate of a PMOS transistor 910. Therefore, by controlling the $I_{DS}$ of the NMOS transistor 902, the feedback voltage ($V_{FB}$) is adjusted based on $V_{DD}$ and the voltage drop ($V_{SD}$) across the PMOS transistor 910.

Figure 10:
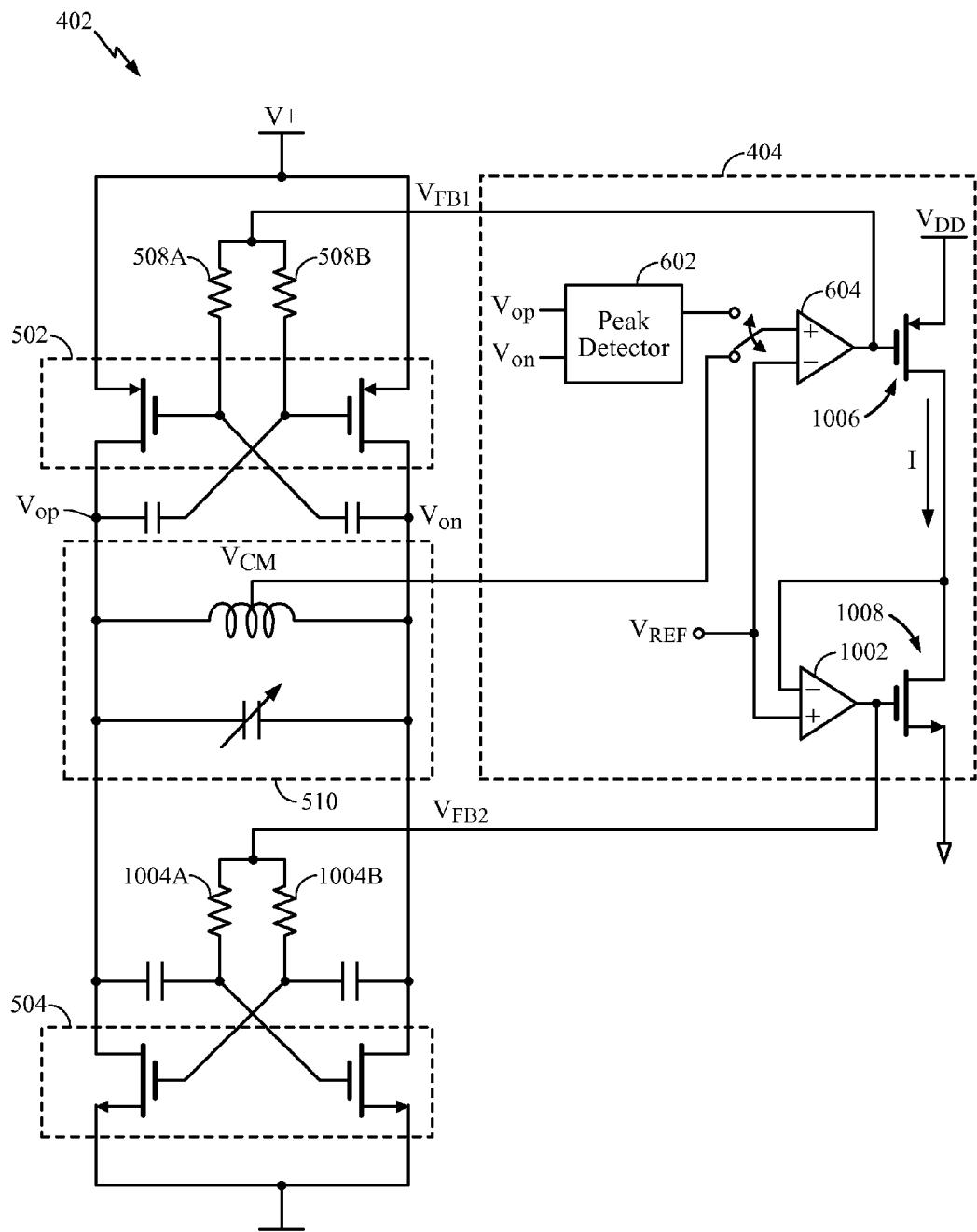
FIG. 10 is a circuit diagram of a VCO and an amplitude adjustment circuit configured to generate two feedback signals to adjust an oscillating signal generated by the VCO, in accordance with certain aspects of the present disclosure.

As illustrated in FIG. 10, the amplitude adjustment circuit 404 may generate two feedback signals to control both sets of cross-coupled transistors 502 and 504, according to certain aspects of the present disclosure. For example, the amplitude adjustment circuit 404 may comprise the amplifier 604 and a second amplifier 1002. The amplifier 604 generates a first feedback signal ($V_{FB1}$) to control the gate voltages of the transistors 502, whereas the amplifier 1002 generates a second feedback signal ($V_{FB2}$) to control the gate voltages of the transistors 504 through a plurality of resistors 1004A and 1004B, for example. The first feedback signal ($V_{FB1}$) also drives a gate of a PMOS transistor 1006. A drain of the PMOS transistor 1006 is coupled with a drain of an NMOS transistor 1008. Therefore, the first feedback signal ($V_{FB1}$) controls a current flowing though the PMOS transistor 1006, which also flows through the NMOS transistor 1008. Therefore, the voltage level ($V_D$) at the drain of the PMOS transistor 1006 is based on $V_{DD}$ and a voltage drop ($V_{SD}$) across transistor 1006 and is derived from the first feedback signal ($V_{FB1}$). The reference voltage ($V_{REF}$) is coupled with the positive terminal of the second amplifier 1002. Thus, the second amplifier 1002 compares the voltage ($V_D$) derived from the first feedback signal and the reference voltage ($V_{REF}$) to generate the second feedback signal ($V_{FB2}$). The second feedback signal ($V_{FB2}$) controls the gate voltages of transistors 504, which may be AC-coupled with the output of the VCO 402, as shown.

Figure 11:
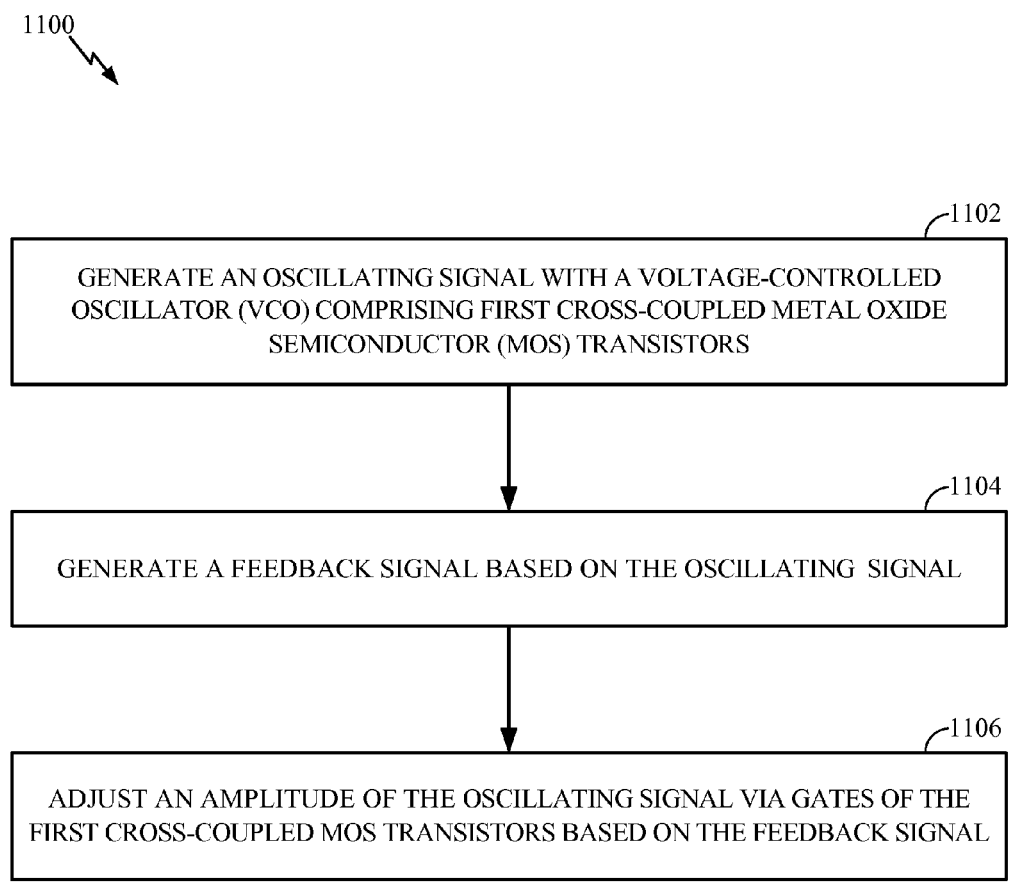
FIG. 11 is a flow diagram of example operations for generating a regulated oscillating signal, in accordance with certain aspects of the present disclosure.

FIG. 11 is a flow diagram of example operations 1100 for generating a regulated oscillating signal, in accordance with certain aspects of the present disclosure. The operations 1100 may be performed, for example, by a VCO and its regulating circuit, such as the circuit illustrated in FIG. 5.

The operations 1100 begin, at block 1102, by generating the oscillating signal with a voltage-controlled oscillator (VCO) comprising first cross-coupled metal oxide semiconductor (MOS) transistors. At block 1104, an amplitude adjustment circuit (e.g., amplitude adjustment circuit 404) generates a feedback signal based on the oscillating signal. At block 1106, the VCO adjusts an amplitude of the oscillating signal via gates of the first cross-coupled MOS transistors based on the feedback signal. As described above, this type of VCO paired with an amplitude adjustment circuit configured to generate feedback to automatically control the VCO's output amplitude may be referred to as an AAC VCO.

According to certain aspects, generating the feedback signal at block 1104 involves generating a voltage representative of the amplitude of the oscillating signal, comparing the generated voltage to a reference voltage, and generating the feedback signal based on the comparison.

In certain aspects, the adjusting at block 1106 includes feeding back the feedback signal to the gates of the first MOS transistors via a plurality of resistors.

In certain aspects, generating the feedback signal at block 1104 entails comparing a common-mode voltage of the oscillating signal and a reference voltage and generating the feedback signal based on the comparison. In this case, the oscillating signal may comprise a differential output, the VCO may further include an inductor coupled between the differential output, and a center tap of the inductor may provide the common-mode voltage for the comparison.

In certain aspects, generating the feedback signal at block 1104 involves controlling a variable resistance, and adjusting the amplitude of the oscillating signal at block 1106 includes controlling the gates of the first MOS transistors based on the variable resistance.

According to certain aspects, generating the feedback signal at block 1104 entails regulating, based on the oscillating signal, a current via a current mirror. Here, the regulated current controls the gates of the first MOS transistors.

In certain aspects, the VCO further includes second cross-coupled MOS transistors. In this case, the operations 1100 may further include the amplitude adjustment circuit comparing a voltage representative of the amplitude of the oscillating signal and a reference voltage to generate the feedback signal and comparing the reference voltage and a voltage based on the feedback signal to generate another feedback signal. The VCO and/or the amplitude adjustment circuit may control the gates of the second MOS transistors based on the other feedback signal. In certain aspects, the first MOS transistors comprise PMOS transistors, and the second MOS transistors comprise NMOS transistors.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2. Means for generating an oscillating signal may comprise a voltage-controlled oscillator, such as the VCO 402 of FIG. 4. Means for generating a feedback signal may comprise an amplitude adjustment circuit, such as the amplitude adjustment circuit 404 of FIG. 4.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An oscillator circuit, comprising:
a voltage-controlled oscillator (VCO) configured to generate a differential oscillating signal from a differential output, the VCO comprising a resonant tank circuit coupled to first cross-coupled metal oxide semiconductor (MOS) transistors whose gates are configured to control an amplitude of the oscillating signal, wherein the resonant tank circuit comprises an inductor coupled between the differential output; and
an amplitude adjustment circuit configured to generate a feedback signal based on the oscillating signal, wherein the feedback signal is configured to control the gates of the first cross-coupled MOS transistors, wherein the amplitude adjustment circuit comprises an amplifier configured to:
compare a voltage from a center tap of the inductor and a reference voltage; and
output the feedback signal based on the comparison.

2. The oscillator circuit of claim 1, wherein the amplitude adjustment circuit further comprises
a peak detecting circuit configured to output a voltage representative of the amplitude of the oscillating signal, wherein the amplifier is further configured to:
compare the voltage output by the peak detecting circuit and the reference voltage; and
output the feedback signal based on the comparison of the voltage output by the peak detecting circuit and the reference voltage.

3. The oscillator circuit of claim 2, wherein the VCO is AC-coupled to the peak detecting circuit.

4. The oscillator circuit of claim 1, wherein the gates of the first MOS transistors are AC-coupled to the differential output of the VCO.

5. The oscillator circuit of claim 1, wherein the feedback signal is fed back to the gates of the first MOS transistors via a plurality of resistors.

6. The oscillator circuit of claim 1, wherein:
the VCO further comprises second cross-coupled MOS transistors;
the amplitude adjustment circuit comprises another amplifier;
the amplifier is further configured to compare a voltage representative of the amplitude of the oscillating signal and the reference voltage to generate the feedback signal; and
the other amplifier is configured to compare the reference voltage and a voltage based on the feedback signal to generate another feedback signal, wherein the other feedback signal controls gates of the second MOS transistors.

7. The oscillator circuit of claim 6, wherein the first MOS transistors comprise PMOS transistors and wherein the second MOS transistors comprise NMOS transistors.

8. The oscillator circuit of claim 1, wherein the first MOS transistors comprise PMOS transistors.

9. An oscillator circuit, comprising:
a voltage-controlled oscillator (VCO) configured to generate an oscillating signal, the VCO comprising cross-coupled metal oxide semiconductor (MOS) transistors whose gates are configured to control an amplitude of the oscillating signal; and
an amplitude adjustment circuit configured to generate a feedback signal based on the oscillating signal, wherein:
the feedback signal is configured to control the gates of the cross-coupled MOS transistors;
the amplitude adjustment circuit comprises an amplifier configured to compare a voltage representative of the amplitude of the oscillating signal and a reference voltage;
an output of the amplifier controls a variable resistance; and
the variable resistance controls the gates of the cross-coupled MOS transistors.

10. A method for generating a regulated oscillating signal, comprising:
generating an oscillating signal with a voltage-controlled oscillator (VCO) comprising first cross-coupled metal oxide semiconductor (MOS) transistors;
generating a feedback signal based on the oscillating signal, the generating the feedback signal comprising:
comparing a common-mode voltage of the oscillating signal and a reference voltage; and
generating the feedback signal based on the comparison; and
adjusting an amplitude of the oscillating signal via gates of the first cross-coupled MOS transistors based on the feedback signal.

11. The method of claim 10, wherein generating the feedback signal comprises:
generating a voltage representative of the amplitude of the oscillating signal;
comparing the generated voltage and the reference voltage; and
generating the feedback signal based on the comparison of the generated voltage and the reference voltage.

12. The method of claim 10, wherein the adjusting comprises feeding back the feedback signal to the gates of the first MOS transistors via a plurality of resistors.

13. The method of claim 10, wherein:
the oscillating signal comprises a differential output;
the VCO further comprises an inductor coupled between the differential output; and
a center tap of the inductor provides the common-mode voltage for the comparison.

14. The method of claim 10, wherein the VCO further comprises second cross-coupled MOS transistors, the method further comprising:
comparing a voltage representative of the amplitude of the oscillating signal and the reference voltage to generate the feedback signal;
comparing the reference voltage and a voltage based on the feedback signal to generate another feedback signal; and controlling gates of the second MOS transistors based on the other feedback signal.

15. The method of claim 14, wherein the first MOS transistors comprise PMOS transistors and wherein the second MOS transistors comprise NMOS transistors.

16. An apparatus for generating a regulated oscillating signal, comprising:
   means for generating an oscillating signal, comprising cross-coupled metal oxide semiconductor (MOS) transistors; and
   means for generating a feedback signal based on the oscillating signal to adjust an amplitude of the oscillating signal via gates of the cross-coupled MOS transistors based on the feedback signal, wherein the means for generating the feedback signal is configured to regulate, based on the oscillating signal, a current via a current mirror and wherein the regulated current controls the gates of the cross-coupled MOS transistors.

* * * * *